(12) United States Patent
Yoneda et al.

(10) Patent No.: US 6,781,224 B2
(45) Date of Patent: Aug. 24, 2004

(54) SEMICONDUCTOR DEVICE AND PACKAGE INCLUDING FORMING PYRAMID MOUNT PROTRUDING THROUGH SILICON SUBSTRATE

(75) Inventors: Yoshiyuki Yoneda, Kawasaki (JP);
Masaharu Minamizawa, Kawasaki (JP); Eiji Watanabe, Kawasaki (JP);
Mitsutaka Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/262,074

(22) Filed: Oct. 2, 2002

(65) Prior Publication Data

US 2003/0160325 A1 Aug. 28, 2003

(30) Foreign Application Priority Data

Feb. 22, 2002 (JP) ........................................ 2002-046448

(51) Int. Cl.[7] .......................... H01L 23/02; H01L 23/48; H01L 23/52; H01L 29/40
(52) U.S. Cl. ........................ 257/686; 257/737; 257/738; 257/780
(58) Field of Search ................................ 257/686, 737, 257/780, 26, 738; 438/106, 108

(56) References Cited

U.S. PATENT DOCUMENTS

| 6,114,221 | A | * | 9/2000 | Tonti et al. ................. 438/455 |
| 6,548,315 | B2 | * | 4/2003 | Kohno et al. ................. 438/17 |
| 2002/0030245 | A1 | * | 3/2002 | Hanaoka et al. ............ 257/621 |

OTHER PUBLICATIONS

Tomita et al.; Fine Bump Bonding in Three–Dimensional Mounting, Electronics Mounting Technology, vol. 17, No. 12, pp. 38–43, 2001.

* cited by examiner

*Primary Examiner*—William M. Brewster
(74) *Attorney, Agent, or Firm*—Westerman, Hattori, Daniels & Adrian, LLP

(57) ABSTRACT

A semiconductor device substrate has fine terminals with a small pitch and is able to be easily produced at a low cost without using a special process. A mounting terminal has a pyramidal shape and extending between a front surface and a back surface of a silicon substrate. An end of the mounting terminal protrudes from the back surface of the silicon substrate. A wiring layer is formed on the front surface of the silicon substrate. The wiring layer includes a conductive layer that is electrically connected to the mounting terminal.

12 Claims, 17 Drawing Sheets

FIG.4

| No. | STEP | FIG. |
|---|---|---|
| 1 | RESIST PATTERNING (Si ETCHING) | 5A |
| 2 | Si ETCHING (PYRAMID) | |
| 3 | REMOVE RESIST | 5B |
| 4 | FORM SiO2 FILM | |
| 5 | METAL SPUTTER (LOWER ELECTRODE FOR MOUNTING) | 5C |
| 6 | RESIST PATERNING (FOR SPUTTER ETCHING) | |
| 7 | LOWER ELECTRODE PLATING | |
| 8 | REMOVE RESIST | |
| 9 | SPUTTER METAL ETCHING | 5D |
| 10 | FORM INSULATING LAYER (+ HOLE FOR VIA) | 5E |
| 11 | METAL SPUTTER (SEED FOR WIRING) | |
| 12 | RESIST PATTERNING (FOR WIRING) | |
| 13 | PLATE WIRING | |
| 14 | REMOVE RESIST | |
| 15 | SEED METAL ETCHING | 5F |
| 16 | FINISH PLATING (OUTERMOST LAYER ONLY) | 5G |
| 17 | BACK GRIND | |
| 18 | DRY ETCHING (Si) | 5H |
| 19 | FORM SiO2 FILM | 5I |
| 20 | INDIVIDUALIZE (DICING) | |

REPEAT (steps 10–14)

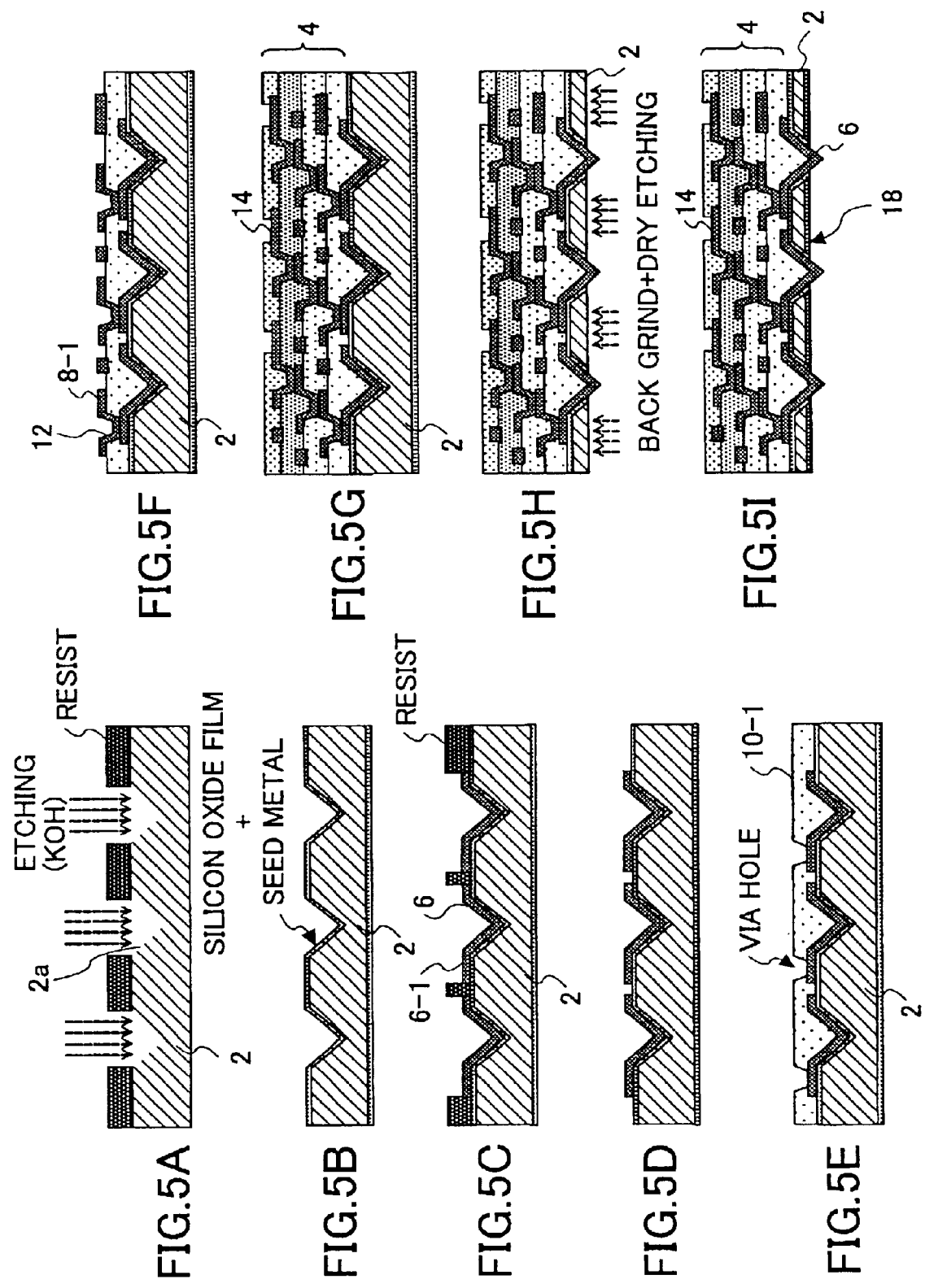

BARE SILICON

MOTHERBOARD

MOTHERBOARD

SEMICONDUCTOR DEVICE AND PACKAGE INCLUDING FORMING PYRAMID MOUNT PROTRUDING THROUGH SILICON SUBSTRATE

BACKGROUND OF THE INVENTION

1. Field of the Invention

The present invention generally relates to semiconductor device substrates and, more particularly, to a semiconductor device substrate using a silicon substrate having fine wires formed thereon and a manufacturing method thereof.

2. Description of the Related Art

With high densification of semiconductor devices, the pitch of mounting terminals of semiconductor devices has become smaller. However, since the connection-terminal pad of a circuit board on which a semiconductor device is mounted is formed with a pitch larger than the pitch of the mounting terminals of the semiconductor device, it is difficult to mount the semiconductor device as it is.

Thus, the semiconductor device is mounted on a substrate, which is referred to as an interposer, so as to mount the semiconductor device on a circuit board via the interposer. That is, the electrodes of the semiconductor device are rearranged by the interposer so as to form mounting terminals having a larger pitch, thereby matching with the pitch of the connection-terminal pads on the circuit board.

Generally, the above-mentioned semiconductor device substrate (interposer) has a multilayer structure in which conductive members extend from a surface on which a semiconductor device is mounted to an opposite surface on which mounting terminals are formed. Generally, an organic fine substrate is used for the interposer. In order to obtain finer wiring pattern, a silicon substrate is used in many cases. A multilayer structure is formed by stacking insulating layers and conductive layers on a silicon substrate. The conductive member that penetrates an insulating layer can be easily formed by a through hole such as a plated via hole of a build-up substrate. A silicon substrate has a relatively large thickness so as to maintain a strength as an interposer. Therefore, a special fabrication process is needed so as to form the conductive members that extend in a direction of the thickness with a fine pitch.

An approach as one method of forming the conductive member that extends through a silicon substrate will be explained below.

First, a thick silicon substrate is prepared, and holes having a thin cylindrical shape are formed in the silicon substrate in the same arrangement as mounting terminals. Each hole having the thin cylindrical shape is referred to as a blind via that extends to the middle of a silicon substrate. After forming an insulating film on an inner surface of each hole, a metal is filled in each hole by electro-plating or filling a metal paste. The filled metal finally becomes the conductive members that penetrate the silicon substrate, and ends thereof serve as mounting terminals to be connected to the circuit board.

A wiring layer is formed on the top surface of the silicon substrate after filling the metal in the holes. The conductive members in the holes of the silicon substrate and the electrode pads formed on the top surface of the wiring layer are electrically connected to each other through via holes or the like. The electrodes of the semiconductor device will be connected to the electrode pads.

After the wiring layer is formed on the top surface of the silicon substrate, ends of the conductive members in the holes of the silicon substrate are exposed by grinding (back-grinding) or etching the back surface of the silicon substrate. The back surface of the silicon substrate may be grinded until the ends of the conductive members in the holes of the silicon surface are grinded, and, thereafter, the ends of the conductive members are protruded by selectively etching only the silicon substrate. The thus-formed protruding ends serves as mounting terminals, and, thus, the semiconductor device mounted on the semiconductor device substrate (interposer) can be flip-chip mounted on the circuit board.

With the above-mentioned fabricating method of the interposer, it is necessary to form a plurality of deep cylindrical holes in a silicon substrate that are arranged in parallel with a small pitch. In order to form such deep holes in a silicon substrate, it is necessary to use a special dry etching method such as reactive ion etching (ICP-RIE). The reactive ion etching is not used in the usual semiconductor device production process (a process for fabricating a mounting substrates such as an interposer), and needs special and expensive apparatuses and processes. Therefore, the manufacturing cost of the semiconductor device substrate (interposer) will increase.

Moreover, the above-mentioned method needs the process for filling a metal in the deep holes in the silicon substrate. However, it is difficult to fill a metal in a deep hole without an air gap or an empty space, and a long process time is needed to fill a metal by plating.

SUMMARY OF THE INVENTION

It is a general object of the present invention to provide an improved and useful semiconductor device substrate in which the above-mentioned problems are eliminated.

A more specific object of the present invention is to provide a semiconductor device substrate having fine terminals with a small pitch and is able to be easily produced at a low cost without using a special process.

In order to achieve the above-mentioned object, there is provided according to one aspect of the present invention a semiconductor device substrate comprising: a silicon substrate having a first surface and a second surface opposite to the first surface; at least one mounting terminal having a pyramidal shape and extending between the first and second surfaces, an end of the mounting terminal protruding from one of the first and second surfaces; and a wiring layer formed on the first surface of the silicon substrate, the wiring layer including a conductive layer that is electrically connected to the mounting terminal.

According to the above-mentioned invention, the mounting terminal having a pyramidal shape can be easily formed by using the recess formed in the silicon substrate since such a recess having a pyramidal shape can be easily formed in the silicon substrate by etching which does not require special processing apparatuses. Additionally, since mounting terminal has a top of the pyramidal shape, the top end of the mounting terminal can be stuck into a member to which the mounting terminal is connected, thereby achieving a good electrical contact.

In the semiconductor device substrate according to the present invention, an insulating film formed of a silicon oxide film may be interposed between the mounting terminal and the silicon substrate. Additionally, the first surface of the silicon substrate may be covered by an insulating layer formed of an organic insulating film. Further, the second surface of the silicon substrate may be covered by an insulating layer formed of an organic insulating film. The wiring layer may have a multiplayer structure in which insulating layers and conductive layers are alternatively stacked.

In the semiconductor device substrate according to the present invention, the pyramidal shape of the mounting terminal may be defined by crystal planes of the silicon substrate. The first and second surfaces of the silicon substrate may be substantially parallel to the (001) plane of silicon crystal. The mounting terminal may have a hollow pyramidal shape. A top end of the mounting terminal may protrude from the second surface of the silicon substrate.

Additionally, there is provided according to another aspect of the present invention a method of manufacturing a semiconductor device substrate, comprising the steps of: forming a recess of a pyramidal shape in a first surface of a silicon substrate; forming an insulating film on the first surface of the silicon substrate and an inner surface of the recess; forming a conductive layer in the recess, the conductive layer being configured and arranged to be a mounting terminal; forming a wiring layer on the first surface of the silicon substrate, the wiring layer including a conductive layer electrically connected to the conductive layer in the recess; and removing the silicon substrate from a second surface opposite to the first surface of the silicon substrate so as to have the conductive layer within the recess exposed in a protruding state.

According to the above-mentioned method, the mounting terminal having a pyramidal shape can be easily formed by using the recess formed in the silicon substrate since such a recess having a pyramidal shape can be easily formed in the silicon substrate by etching which does not require special processing apparatuses. Additionally, since mounting terminal has a top of the pyramidal shape, the top end of the mounting terminal can be struck into a member to which the mounting terminal is connected, thereby achieving a good electrical contact.

In the method according to the present invention, the step of forming the recess may include a step of removing a predetermined part of the silicon substrate in a pyramidal shape by etching. The method according to the present invention may further includes a step of forming an insulating film on a second surface of the silicon substrate opposite to the first surface after the step of removing the silicon substrate.

The step of forming the insulating film on the second surface may include a step of forming a silicon oxide film on the second surface. Alternatively, the step of forming the insulating film on the second surface may include a step of forming an organic insulating film on the second surface. The step of removing may include: a first step of grinding the second surface of the silicon substrate; and a second step of removing the silicon substrate by etching after the first step so as to have an end of the mounting terminal protrude from the etched surface.

Additionally, there is provided according to another aspect of the present invention a semiconductor package comprising: a semiconductor device substrate; and a semiconductor element having at least one metal bump formed on an electrode pad thereof, wherein the semiconductor device substrate comprising: a silicon substrate having a first surface and a second surface opposite to the first surface; at least one mounting terminal having a pyramidal shape and extending between the first and second surfaces, an end of the mounting terminal protruding from one of the first and second surfaces; and a wiring layer formed on the first surface of the silicon substrate, the wiring layer including a conductive layer that is electrically connected to the mounting terminal, and wherein an end of the mounting terminal of the semiconductor device substrate is connected to the metal bump in a state where the end of the mounting terminal protrudes into the metal bump. Accordingly, a good electrical connection can be achieved between the semiconductor element and the semiconductor device substrate.

Additionally, there is provided according to another aspect of the present invention a semiconductor package comprising: a semiconductor device substrate; and a semiconductor element having at least one metal bump formed on an electrode pad thereof, wherein the semiconductor device substrate comprising: a silicon substrate having a first surface and a second surface opposite to the first surface; at least one mounting terminal having a pyramidal shape and extending between the first and second surfaces, an end of the mounting terminal protruding from one of the first and second surfaces; and a wiring layer formed on the first surface of the silicon substrate, the wiring layer including a conductive layer that is electrically connected to the mounting terminal, and wherein the semiconductor element is mounted on the wiring layer of the semiconductor device substrate, and the mounting terminal of a pyramidal shape is used as an external connection terminal. Accordingly, the external connection terminal of the semiconductor package becomes a pyramidal shape, which provides a good electrical connection when the semiconductor package is connected to a circuit board.

Additionally, there is provided according to another aspect of the present invention a semiconductor package comprising: a semiconductor element; a semiconductor device substrate having a first surface and a second surface opposite to the first surface, the semiconductor element being mounted on the first surface; and a package substrate facing the second surface of the semiconductor device substrate and electrically connected to the semiconductor element via the semiconductor device substrate, wherein the semiconductor device substrate comprising: a silicon substrate having the first surface and the second surface opposite to the first surface; at least one mounting terminal having a pyramidal shape and extending between the first and second surfaces, an end of the mounting terminal protruding from one of the first and second surfaces; and a wiring layer formed on the first surface of the silicon substrate, the wiring layer including a conductive layer that is electrically connected to the mounting terminal. Since the semiconductor device substrate can be formed in a fine structure, the semiconductor element having a fine structure can be mounted on the package substrate without forming the package substrate in a fine structure.

Other objects, features and advantages of the present invention will become more apparent from the following detailed description when read in conjunction with the accompanying drawings.

BRIEF DESCRIPTION OF THE DRAWINGS

FIG. 4 is an illustration for explaining a manufacturing process of the interposer;

FIGS. 5A through 5I are cross-sectional views of the interposer in the steps shown in FIG. 4;

DETAILED DESCRIPTION OF THE PREFERRED EMBODIMENTS

Figure 1:
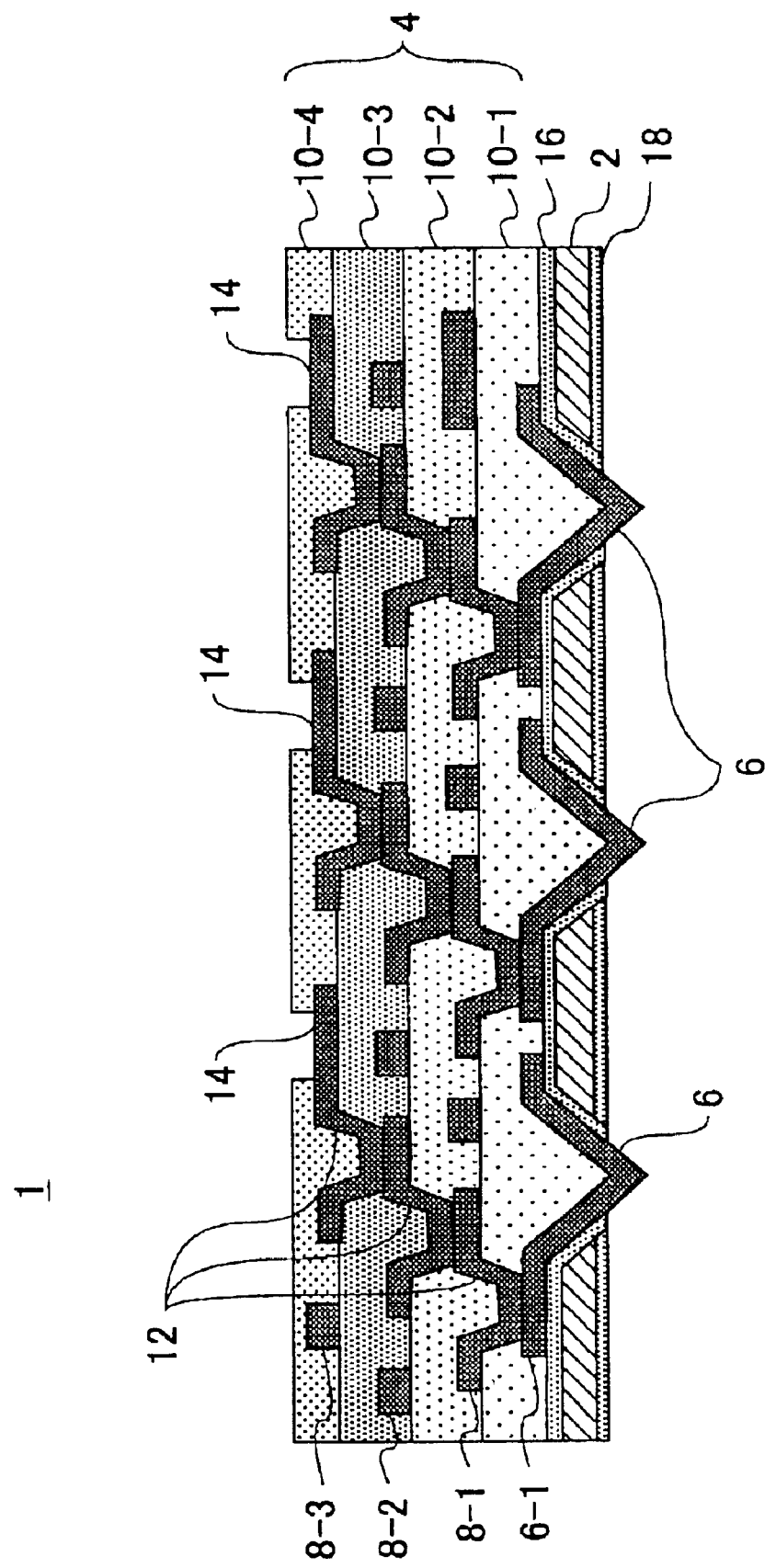
FIG. 1 is an enlarged cross-sectional view of an interposer according to a first embodiment of the present invention.

A description will now be given, with reference to FIG. 1, of an interposer, which is a semiconductor device substrate according to a first embodiment of the present invention. FIG. 1 is an enlarged cross-sectional view of the interposer 1 according to the first embodiment of the present invention.

The interposer 1 shown in FIG. 1 comprises a silicone substrate 2, a multilayer wiring layer 4 formed on the top surface of the silicone substrate 2 and a plurality of mounting terminals 6 projected from the undersurface of the silicone substrate 2. A semiconductor element is mounted on the upper side of the wiring layer 4 of the interposer 1 so that a semiconductor package is formed. The semiconductor package is flip-chip mounted onto a circuit board via the mounting terminals 6 that protrude from the undersurface of the silicone substrate 2.

Figure 2:
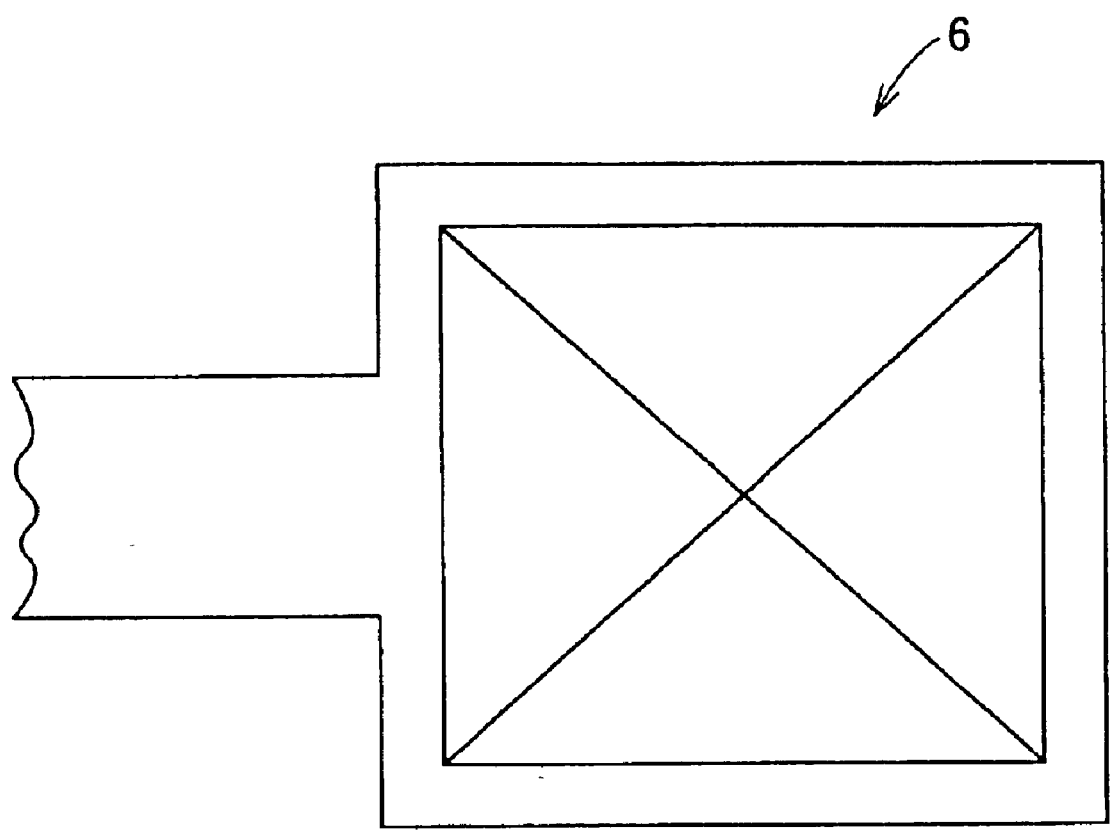
FIG. 2 is a plan view of a mounting terminal viewed from a top end side.
Figure 3A:
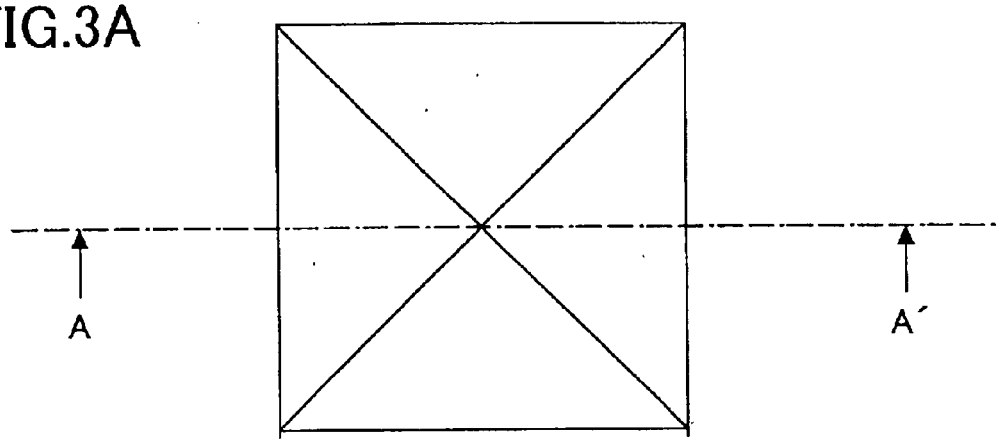
FIG. 3A is a plan view of a recess formed in a substrate.
Figure 3B:
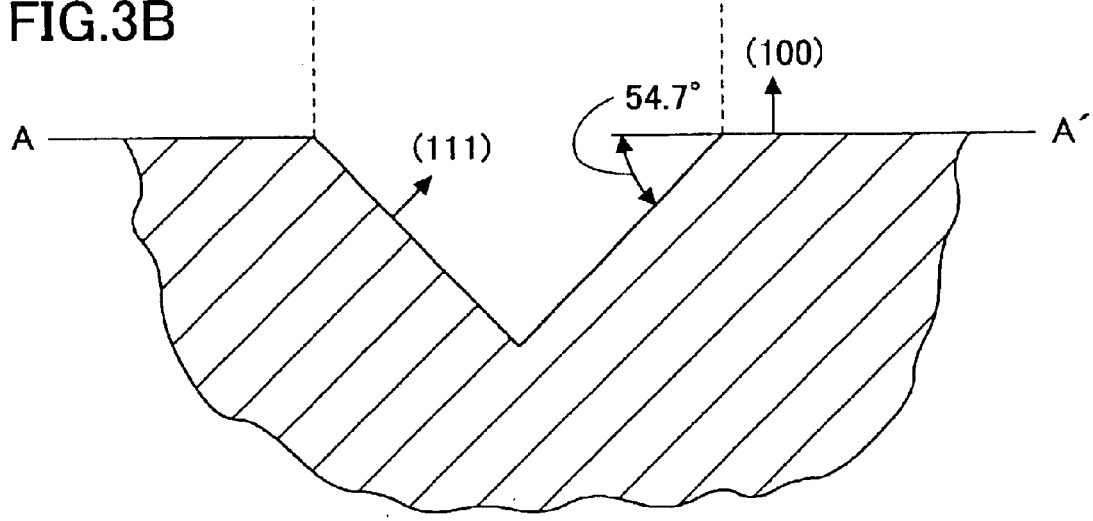
FIG. 3B is a cross-sectional view of a part of the substrate where the recess is formed.

The mounting terminals 6 are formed of a conductive layer, and the outside configuration thereof is a pyramidal shape as shown in FIG. 2. The top part of the pyramidal shape is projected from the undersurface of the silicone substrate 2. Each of the mounting terminals 6 has a configuration corresponding to a configuration (a reverse pyramidal shape) of a recess, which is obtained by a difference in the etching rate between the plane (111) and other planes, as shown in FIGS. 3A and 3B, by etching the silicone substrate 2 from the plane (100) side. A method of forming the mounting terminals 6 is explained in detail later, The multilayer wiring layer 4 formed on the top surface side of the silicone substrate 2 has a multilayer structure containing conductive layers 8-1, 8-2 and 8-3 formed as wiring patterns and insulating layers 10-1, 10-2, 10-3 and 10-4 which insulate between conductive layers. The conductive layers 8-1, 8-2 and 8-3 and a conductive layer 6-1 which extends from the root parts of the mounting terminals 6 are connected by vias 12. Thereby, connection pads 14 formed in the conductive layer 83 of the uppermost layer are electrically connected to the corresponding mounting terminals 6.

It should be noted that the multilayer wiring structure of the above-mentioned multilayer wiring layer 4 is the same as a multilayer wiring structure of an existing organic fine substrate, and the detailed explanation thereof will be omitted. Additionally, a silicone oxide film 16 is formed as an insulating layer on the top surface of the silicon substrate and an inner surface of each recess in which the mounting terminal is formed. The silicone oxide film 18 is also formed as an insulating film on the undersurface of the silicone substrate 2. It should be noted that an organic insulating film may be formed instead of the silicone oxide film.

It should be noted that, in the present embodiment, the thickness of the silicone substrate 2 is about 30 $\mu$m, and the thickness of the conductive layer which constitutes the mounting terminal 6 is equal to or greater than 5 $\mu$m. The pitch of the mounting terminals 6 is about 200 $\mu$m (150 $\mu$m), and the projecting length of the end of each of the mounting terminals 6 from the back surface of the silicone substrate 2 is about 40 $\mu$m.

A description will now be given, with reference to FIG. 4 and FIGS. 5A through 5I, of a manufacturing method of the interposer 1 according to the present embodiment. FIG. 4 is an illustration for explaining a manufacturing process of the interposer 1. FIGS. 5A through 5I are cross-sectional views of the interposer 1 in the steps shown in FIG. 4.

First, the silicon substrate of a thickness of 650 mc having a silicon oxide film thereon is prepared, and a resist layer is formed, in step 1, on a top surface of the silicon substrate. Then, openings corresponding to a configuration of each recess 2a in which the mounting terminal 6 is formed by patterning the resist layer. Next, in step 2, the silicon substrate 2 is etched using etchant such as 40% KOH solution so as to form the recesses 2a (refer to FIG. 5A). In the present embodiment, the silicone substrate 2 having a surface parallel to the crystal plane (001) is used. Therefore, when the silicon substrate 2 is etched from a front surface side, the recesses 2a having a reverse pyramidal shape are formed due to the difference in the etching rate between crystal plane (111) and other crystal planes of the silicone substrate (for example, (110):(111)=180:1).

Next, in step 3, the resist is removed, and the silicon oxide film ($SiO_2$) is formed, in step 4, as an insulating layer on the front surface of the silicon substrate 2. Since the silicon oxide film is formed by heat treatment, the silicon oxide film is formed on the entire surface of the silicon substrate 2 including the front surface, inner surfaces of the recesses 2a and the back surface of the silicon substrate 2. The formation of the silicon oxide film may be performed by a chemical vapor deposition (CVD) method. Then, in step 5, a seed metal layer of a thickness of, for example, 1 $\mu$m or less is formed on the silicon oxide film formed on the front surface of the silicon substrate 2 and the inner surfaces of the recesses 2a by sputtering or electroless plating (refer to FIG. 5B). The seed metal layer is preferably formed by sputtering of chromium (Cr) or titanium (Ti).

Next, in step 6, a resist layer is formed on the seed metal layer and the resist layer is patternized so that the mounting terminals 6 and the conductive layer 6-1 are formed. Then, in step 7, a conductive layer which is made of a metal is formed on the seed metal layer. In the present embodiment, the conductive layer is formed of copper by Cu electrolytic plating (refer to FIG. 4C). The conductive layer corresponds to the mounting terminals 6 and the conductive layer 6-1, and the thickness of the conductive layer is about 5 $\mu$m. Since the conductive layer is formed along the inner surface of each recess 2a, the outside configuration of the mounting terminal 6 becomes pyramidal shape.

Next, the resist is removed in step 8, and the seed metal layer which exists under the removed resist is removed by etching in step 9. Since the seed metal layer has a small thickness, light etching may be sufficient. Then, in step 10, an insulating layer 10-1 is formed on the front surface side of the silicon substrate 2, and through holes are formed at positions where the vias 12 are formed (refer to FIG. 5E). The insulating layer 10-1 is formed by spin coating of polyimide or benzo-cyclobutene (BCB).

Next, in step 11, a seed metal layer is formed by sputtering on the insulating layer 10-1, and a resist layer is formed and patternized on the seed metal layer in step 12. Then, in step 13, a conductive layer 8-1 which corresponds to a circuit pattern is formed by metal plating (copper electrolytic plating). At this time, the vias 12 which connect electrically the conductive layer 8-1 and the conductive layer 6-1 are also formed simultaneously. Then, the resist is removed in step 14 and the seed metal is etched in step 15 (refer to FIG. 5F).

The multilayer wiring layer 4 is formed by repeating the above-mentioned steps 10 through 15 (refer to FIG. 5G). After forming the necessary multilayer structure, nickel plating and gold plating are applied, in step 17, to connection pads 14 formed in the uppermost layer (a conductive layer 8-3 in the present embodiment.).

Next, in step 17, the back surface of the silicon substrate 2 is ground using an abrasive or a grinding stone (back grinding). At this time, the grinding is proceeded slightly before the top ends of the mounting terminals 6 formed in the silicone substrate 2. Then, in step 18, only the silicon substrate 2 and the silicon oxide film are selectively removed by dry etching using a plasma gas so as to expose the top ends of the mounting terminals 6 (refer to FIG. 5H). In this process, the silicon oxide film (which was formed in step 4) adhering to the top ends of the mounting terminals 6 is also removed simultaneously. Additionally, the thickness of the silicon substrate 2 is finally set to about 30 $\mu$m. Then, in step 19, a silicon oxide film 18 as an insulating film is formed on the back surface of the silicon substrate 2 by CVD.

In the above-mentioned process, in order to form a plurality of the interposers 1 on a wafer-like silicon substrate 2 collectively, the interposer 1 shown in FIG. 1 is completed by dicing the silicon substrate 2 so as to individualize the interposer 1.

Figure 6A:
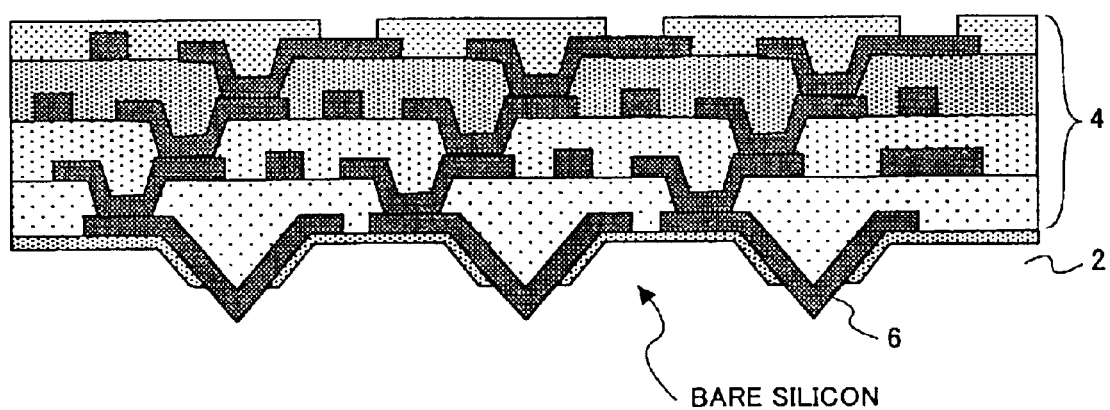
FIG. 6A is a cross-sectional view of an interposer having no insulating film on a back surface.
Figure 6B:
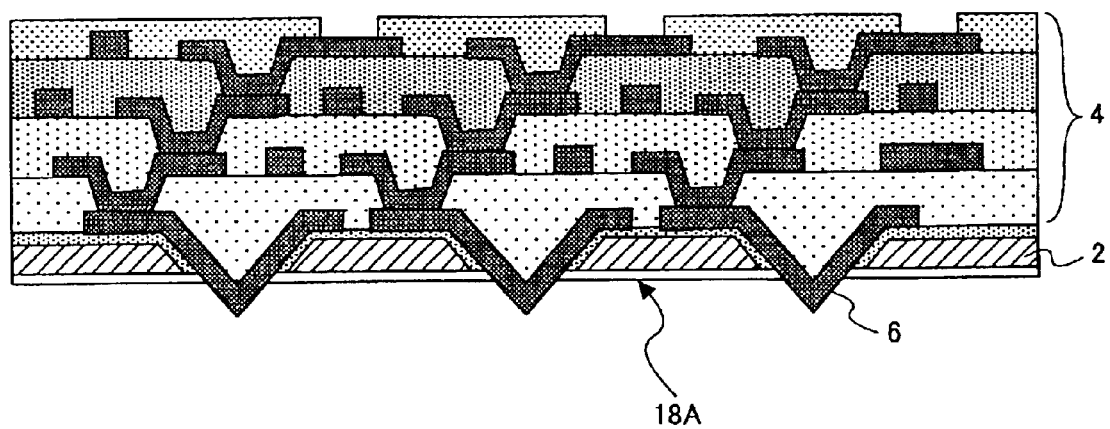
FIG. 6B is a cross-sectional view of an interposer having an organic insulating film on a back surface.

Here, as shown in FIG. 6A, the silicon substrate 2 may be in a state where the back surface is exposed without forming the silicon oxide film 18 in step 19. The reason for forming the insulating film in step 19 is for avoiding a short circuit between the exposed top ends of the mounting terminals 6 and the back surface of the silicon substrate 2. However, since the silicon oxide film 16 is interposed as an insulating layer between the mounting terminals 6 and the silicon substrate 2, the insulation can be maintained at certain level even if the back surface of the silicon substrate 2 is not covered by the insulating layer. Moreover, as shown in FIG. 6B, an organic insulating film 18A may be formed by a spin-coating method or the like instead of the silicone oxide film 18.

A description will now be given of an example of forming a semiconductor package using the above-mentioned interposer 1.

Figure 7:
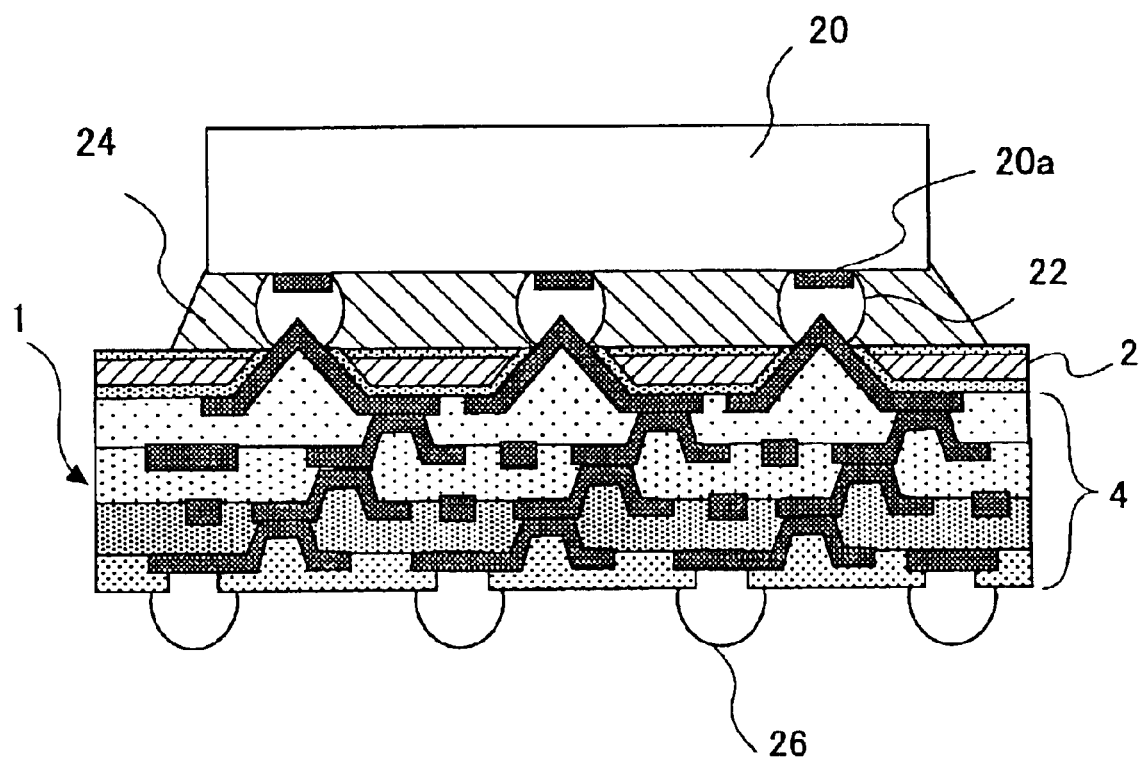
FIG. 7 is a cross-sectional view of a semiconductor package, which is formed by mounting a semiconductor device to mounting terminals of the interposer shown in FIG. 1.

FIG. 7 is a cross-sectional view of a semiconductor package, which is formed by mounting a semiconductor device to the mounting terminals 6 of the interposer 1. Solder bumps 22 are formed on electrode terminals 20a of the semiconductor device 20, and the solder bumps 22 are joined to the mounting terminals 6 of the interposer 1. Since each of the mounting terminals 6 is the top end of the pyramid and is made sharp, the mounting terminals 6 can be made protrude into the solder bumps 22 by merely pushing the solder bump 22, thereby achieving a good electric contact. It should be noted that gold bumps may be used instead of the solder bumps. In this state, an under-fill material 24 is filled between the interposer 1 and the semiconductor device 20 so as to fix the interposer 1 to the semiconductor device 20.

Figure 8:
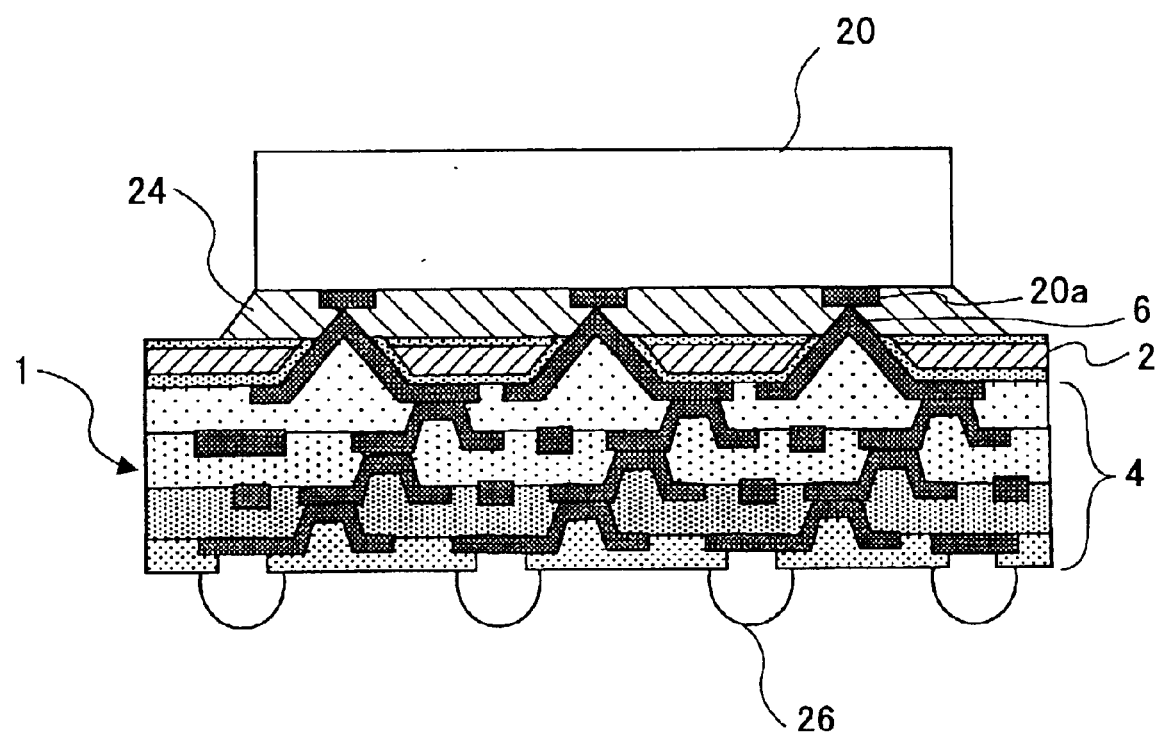
FIG. 8 is a cross-sectional view of a semiconductor package in which a semiconductor device is connected to the mounting terminals of the interposer shown in FIG. 1.

Moreover, as shown in FIG. 8, the mounting terminals 6 may be directly connected to electrode pads 20a of the semiconductor device 20. In this case, a soft metal film is used for the metal (mounting terminals 6) on the electrode surface, and the interposer 1 is fixed by the under-fill material after the soft metal film is brought into contact with the electrode pads 20. Even in this case, a good electric contact can be obtained between the mounting terminals 6 and the electrode pads 20 due to the action of the mounting terminals 6 having sharp top ends.

Figure 9:
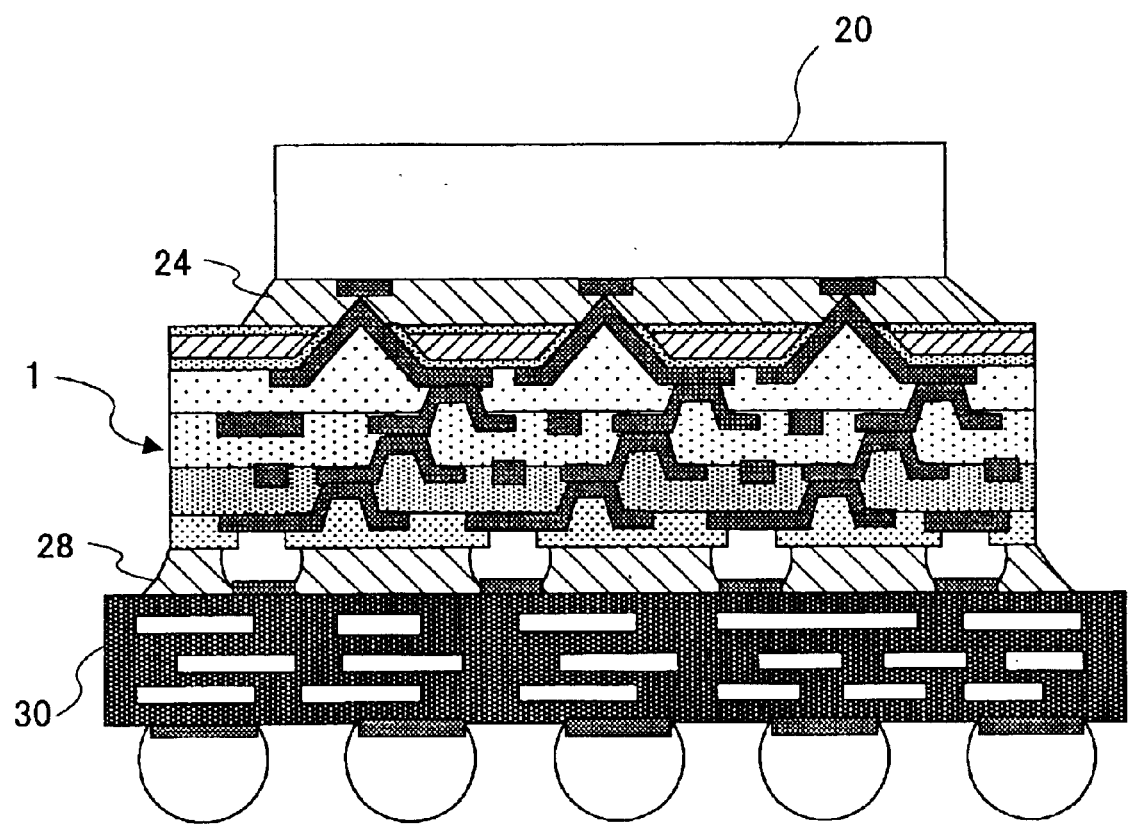
FIG. 9 is a cross-sectional view of a semiconductor package, which is formed by mounting the semiconductor package of FIG. 7 onto a package substrate.

Furthermore, the semiconductor package shown in FIGS. 7 and 8 can be further mounted on a package substrate 30 so as to form a semiconductor package. FIG. 9 is a cross-sectional view of the semiconductor package, which is formed by mounting the semiconductor package of FIG. 7 onto the package substrate 30. As for the package substrate 30, various substrates can be used such as a glass ceramic substrate, an alumina substrate, a build-up substrate, an FR-4 substrate and an organic substrate like a BT substrate. Moreover, after the interposer 1 as a relay substrate is mounted on the package substrate 30, the semiconductor package containing the interposer 1 is fixed to the package substrate 30 by filling an under-fill material 28 between the interposer 1 and the package substrate 30. As shown in FIG. 9, the semiconductor package can be formed by using the interposer 1 as a relay substrate without providing fine wirings on the package substrate even if the number of electrode pads of the semiconductor element is large and the electrode pads have fine structure.

Figure 10:
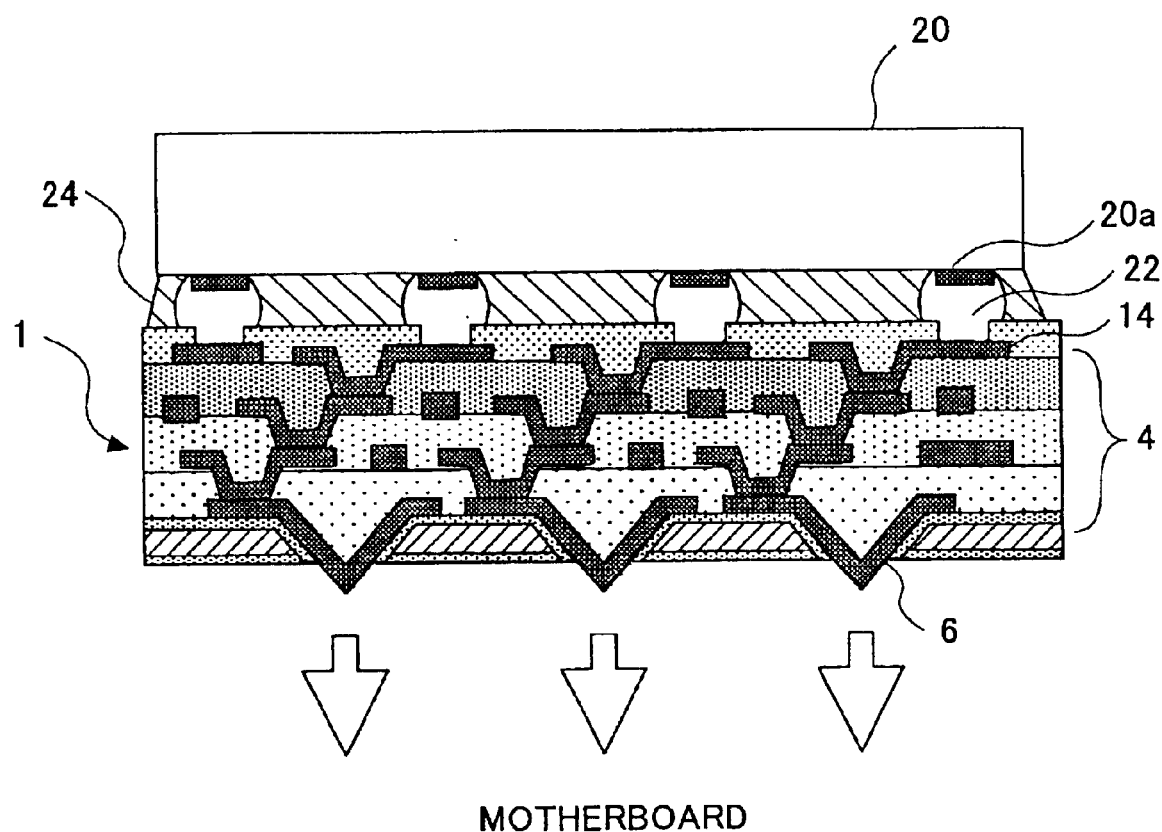
FIG. 10 is a cross-sectional view of a semiconductor package, which is formed by flip-chip mounting a semiconductor device on a side of the connection pads 14 of the interposer show in FIG. 1.

FIG. 10 is a cross-sectional view of a semiconductor package, which is formed by flip-chip mounting the semiconductor device 20 on the side of the connection pads 14 of the interposer 1. The electrode pads 20a of the semiconductor device 20 and the connection pads 14 of the interposer 1 are connected to each other by the solder ball 26. The solder balls 26 may be previously provided to the electrode pads 20a of the semiconductor device 20, or may be provided to the connection pads 14 of the interposer 1. In the case of the semiconductor package shown in FIG. 10, the semiconductor package is mounted to a circuit board such as a motherboard using the mounting terminals 6.

Figure 11:
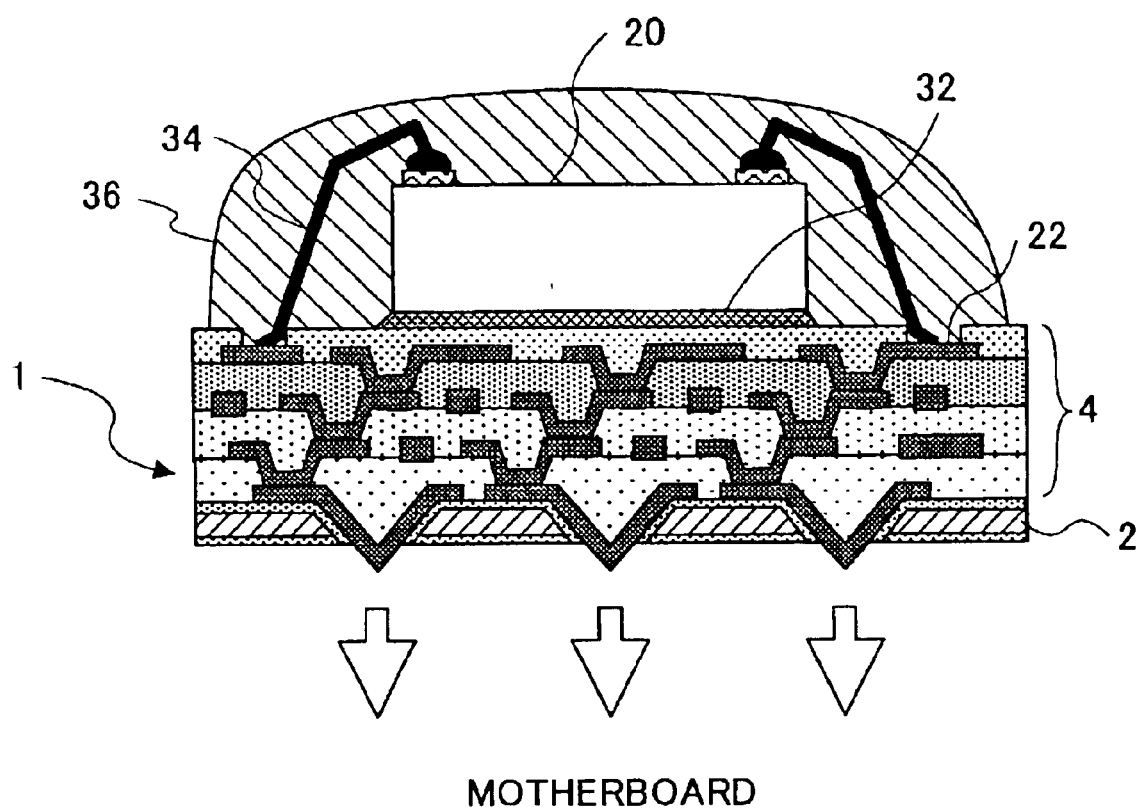
FIG. 11 is a cross-sectional view of a semiconductor package, which is formed by wire-bonding a semiconductor device to the interposer shown in FIG. 1.

FIG. 11 is a cross-sectional view of the semiconductor package, which is formed by wire-bonding the semiconductor device 20 to the connection pads 14 of the interposer 1. The semiconductor device 20 is mounted on the multilayer wiring layer 4 of the interposer 1 in a face-up state and is fixed by a silver paste 32 or the like. Then, the electrode pad 20a of the semiconductor device 20 and the connection pads 14 of the interposer 1 are electrically connected to each other by bonding wires 34 such as gold wires. Although the semiconductor device 20 and the gold wires 34 are encapsulated by a bonding seal resin 36, it can be encapsulated by transfer mold method. It should be noted that, although FIGS. 10 and 11 show the examples in which a single semiconductor element is mounted, a plurality of semiconductor elements may be mounted.

Figure 12:
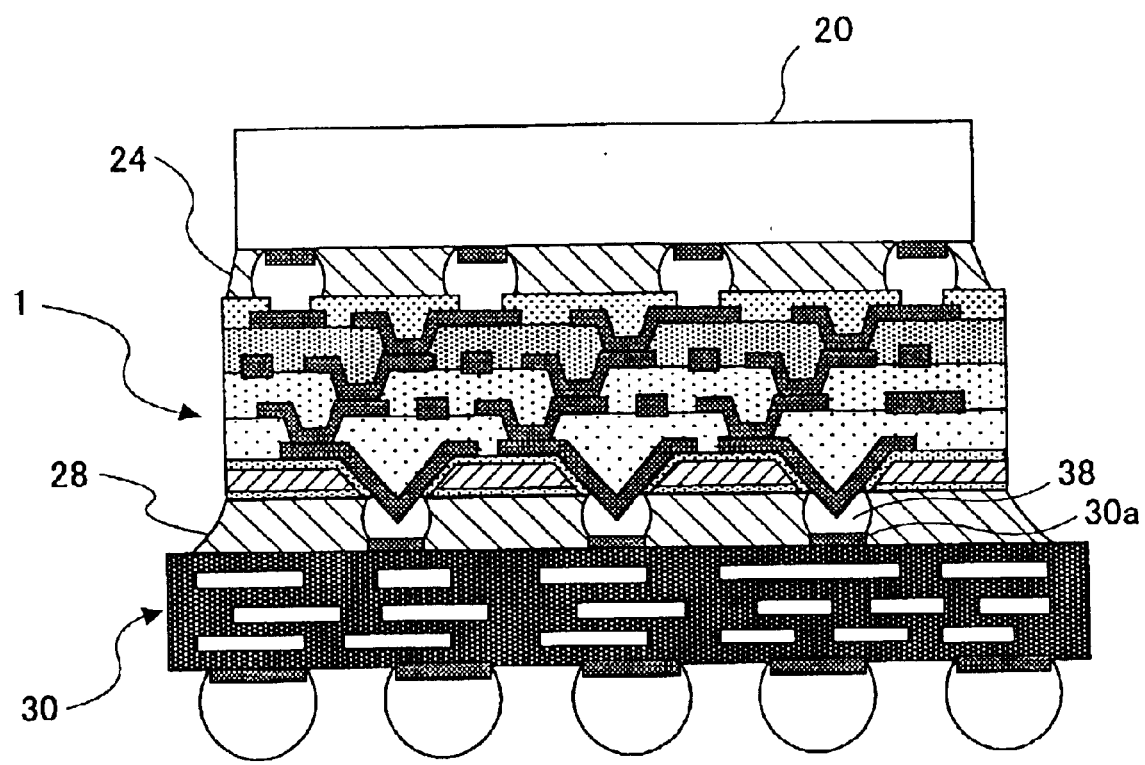
FIG. 12 is a cross-sectional view of a semiconductor package, which is formed by mounting the semiconductor package shown in FIG. 10 further to a package substrate.

FIG. 12 is a cross-sectional view of a semiconductor package, which is formed by mounting the semiconductor package shown in FIG. 10 further to the package substrate 30. In the example shown in FIG. 12, the mounting terminals 6 of the interposer 1 and the connection pads 30a of the package substrate 30 are connected via solder bumps 38. The solder bumps 38 may be provided to the mounting terminals 6 beforehand, or provided to the connection pads 30a of the package substrate 30. Moreover, gold (Au) bumps may be used instead of the solder bumps. By forming the solder bumps 38 on the connection pads 30a beforehand, sufficient electrical connection can be obtained only by pressing the mounting terminals 6 onto the solder bumps so as to protrude the ends of the mounting terminals 6 into the solder bumps.

Figure 13:
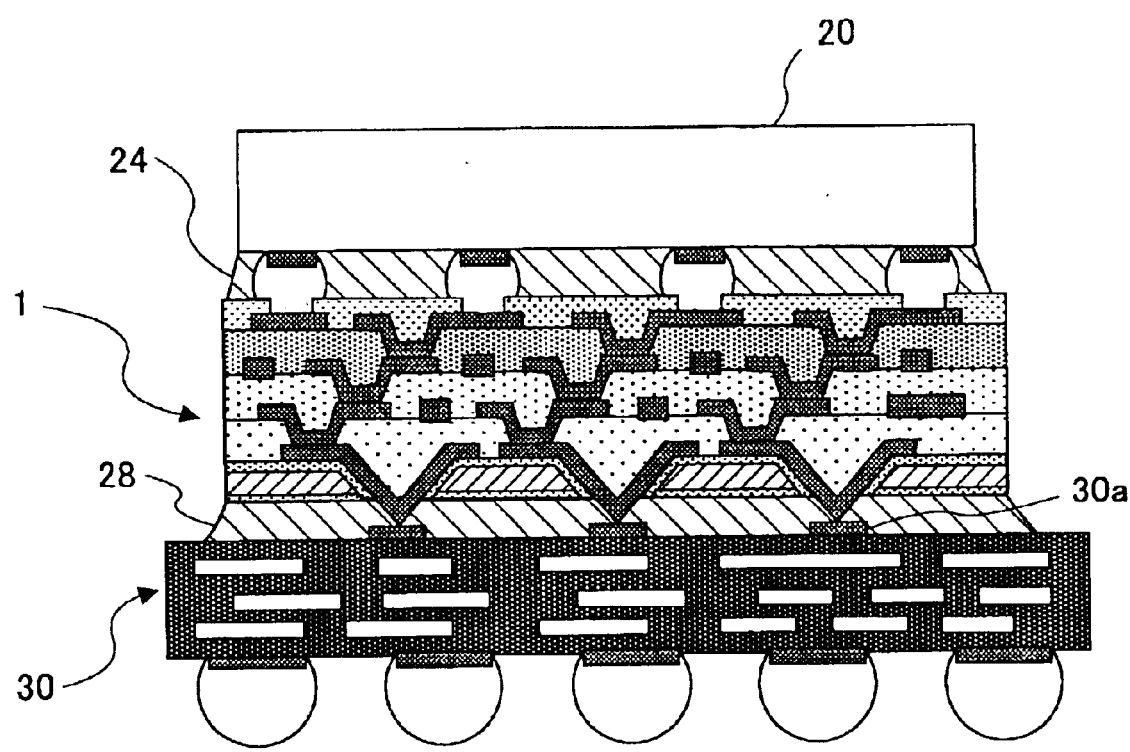
FIG. 13 is a cross-sectional view of the semiconductor package shown in FIG. 12 in which the mounting terminals are directly connected to the connection pads of the package substrate without using solder bumps.

FIG. 13 is a cross-sectional view of the semiconductor package shown in FIG. 12 in which the mounting terminals 6 are directly connected to the connection pads 30a of the package substrate 30 without using solder bumps. In this case, sufficient electrical connection can be obtained by making the top ends of the mounting terminals 6 protrude into the connection pads of the package substrate 30.

Figure 14:
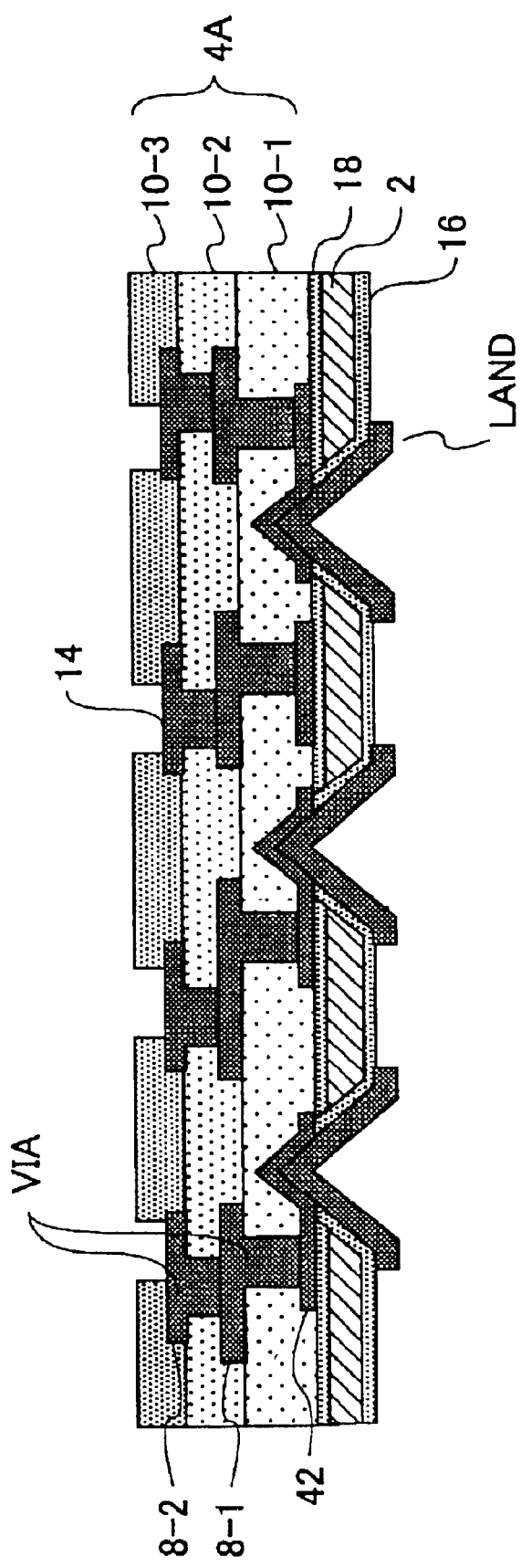
FIG. 14 is an enlarged cross-sectional view of an interposer according to a second embodiment of the present invention.

A description will now be given, with reference to FIG. 14 and FIGS. 15A through 15H, of a semiconductor device substrate according to the second embodiment of the present invention. FIG. 14 is an enlarged cross-sectional view of an interposer 40 according to the second embodiment of the present invention. FIGS. 15A through 15H are cross-sectional views of the interposer 40 shown in FIG. 14 during the manufacturing process. In FIGS. 14 and 15A through 15H, parts that are the same parts shown in FIG. 1 are given the same reference numerals, and descriptions thereof will be omitted.

The interposer 40 according to the second embodiment of the present invention has a structure in which a multilayer wiring layer 4A is formed on the back surface side of the silicon substrate 2 in the interposer 1 shown in FIG. 1. Therefore, the top ends of the mounting terminals 6 protrude into the multilayer wiring layer 4A, and portions formed along the inner surfaces of the recesses 2a of the silicon substrate 2 serve as external connection terminals.

In the manufacturing process shown in FIGS. 15A through 15H, the process shown in FIGS. 15A through 15D corresponds to the process shown in FIGS. 5A through 5D. However, in FIG. 15C, the conductive layer is formed only in the parts used as the mounting terminals 6, and the conductive layer 6-1 is not formed.

Figure 15:
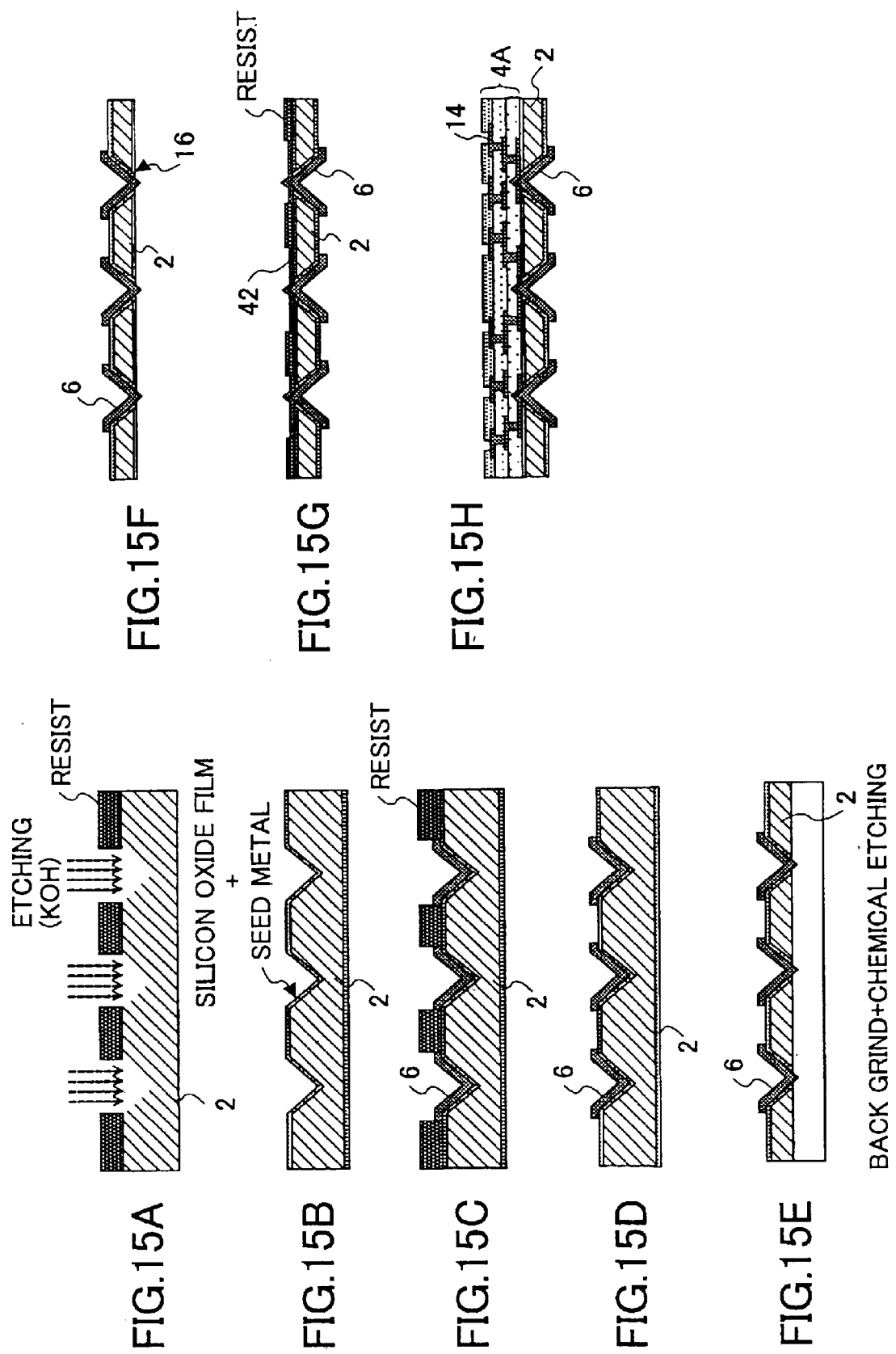
FIGS. 15A through 15H are cross-sectional views of the interposer shown in FIG. 14 during a manufacturing process.

In the present embodiment, the back grinding and chemical etching are performed immediately after the mounting terminals 6 are formed on the silicon substrate 2, as shown in FIG. 15E. This process can be performed in the same manner as the process shown in FIG. 5H. Thereby, The top ends of the mounting terminals are in the state where they protrude from the back surface of the silicon substrate 2. Next, as shown in FIG. 15F, the silicon oxide film 18 is formed on the back surface of the silicon substrate 2 as an insulating film. An organic insulating film may be formed instead of the silicone oxide film.

Then, as shown in FIG. 15G, a conductive layer 42 is formed on the back surface of the silicon substrate 2 by using a mask which is formed by a patternized resist on the back surface of the silicon substrate 2. The conductive layer 42 is formed as pattern wiring connected to the top ends of the mounting terminals 6. Then, as shown in FIG. 15H, the multilayer wiring layer 4A is formed on the conductive layer 42 so as to form the connection pads 14 in the uppermost part, and the interposer 40 shown in FIG. 14 is completed. It to should be noted that although the multilayer wiring layer 4A shown in FIG. 14 has the three-layer structure, the layer 4A may have the four-layer structure as in the multilayer wiring layer 4 shown in FIG. 1 or may be a layered structure having an arbitrary number of layers.

Figure 16:
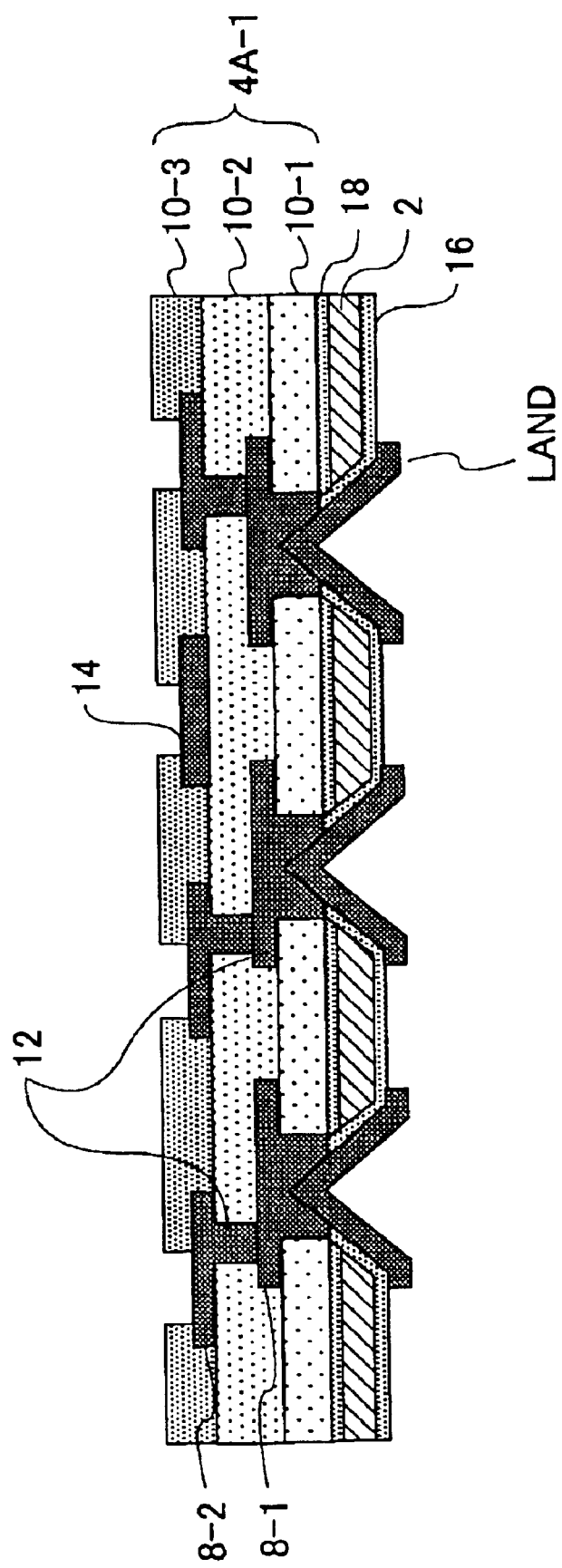
FIG. 16 is a cross-sectional view of an interposer, which is a variation of the interposer shown in FIG. 14.

FIG. 16 is a cross-sectional view of the interposer 40A, which is a variation of the interposer shown in FIG. 14. In the interposer 40A, the conductive layer 8-1 of the multilayer wiring layer 4A-1 and the mounting terminals 6 are connected through the vias 12 without providing the conductive layer 42.

Figure 17:
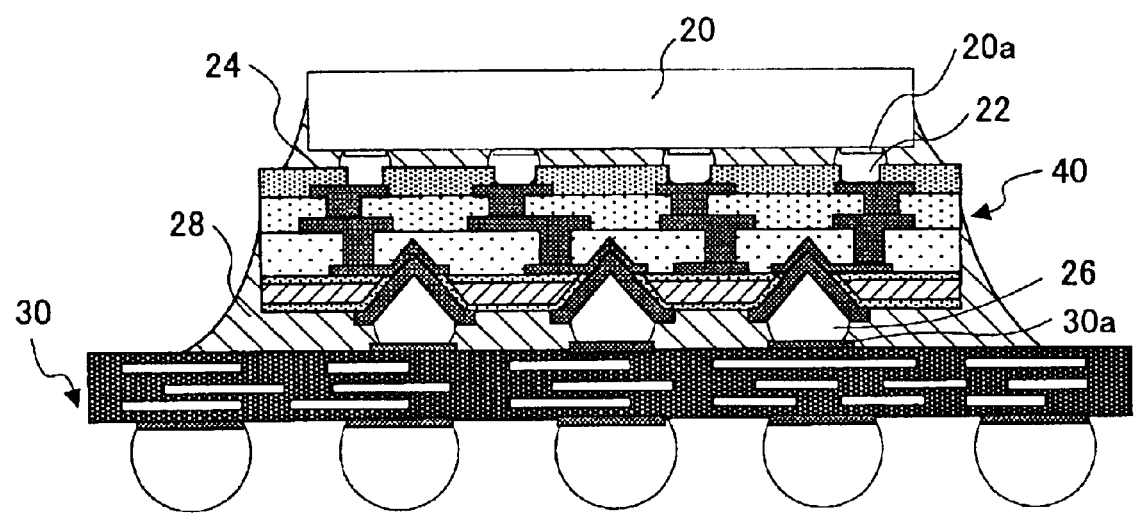
FIG. 17 is a cross-sectional view of a semiconductor package incorporating the interposer shown in FIG. 14.

FIG. 17 is a cross-sectional view of a semiconductor package incorporating the interposer 40 shown in FIG. 14. The semiconductor device 20 is mounted on the package substrate 30 via the interposer 40. That is, and electrode pads 20a of the semiconductor device 20 are connected to the connection pads 14 of the interposer 40 by the solder bumps 22, and the semiconductor device 20 and the interposer 40 are fixed to each other by the under-fill material 24 filled therebetween. Additionally, the mounting terminals 6 of the interposer 40 and the connection pads 30a of the package substrate 30 are connected through the solder bumps 26, and the interposer 40 and the package substrate 30 are fixed to each other by the under-fill material filled therebetween. Since the solder balls are accommodated inside the pyramidal shaped mounting terminals 6, the contact area is large which gives a positive contact.

In the above-mentioned embodiments, the silicon substrate is used as a substrate of the interposer, and pyramidal shaped recesses are formed by etching so as to form the mounting terminals having the corresponding pyramidal shape. The present invention is not limited to the silicon substrate, and any substrate can be used if it is easy to form a recess having a pyramidal shape including a triangular pyramid, a pentagonal pyramid or other polygonal pyramid. Moreover, the configuration of the recess is not limited to the pyramidal shape, and a circular cone configuration where the degree of point angle is comparatively large may be used.

The present invention is not limited to the specifically disclosed embodiments, and variations and modifications may be made without departing from the scope of the present invention.

What is claimed is:

1. A semiconductor device substrate comprising:
   a silicon substrate having a first surface and a second surface opposite to the first surface;
   at least one mounting terminal having a pyramidal shape and extending between said first and second surfaces, an end of said mounting terminal protruding from one of said first and second surfaces; and a wiring layer formed on said first surface of said silicon substrate, the wiring layer including a conductive layer that is electrically connected to the mounting terminal.

2. The semiconductor device substrate as claimed in claim 1, wherein an insulating film formed of a silicon oxide film is interposed between said mounting terminal and said silicon substrate.

3. The semiconductor device substrate as claimed in claim 1, wherein said first surface of said silicon substrate is covered by an insulating layer formed of an organic insulating film.

4. The semiconductor device substrate as claimed in claim 1, wherein said second surface of said silicon substrate is covered by an insulating layer formed of an organic insulating film.

5. The semiconductor device substrate as claimed in claim 1, wherein said wiring layer has a multiplayer structure in which insulating layers and conductive layers are alternatively stacked.

6. The semiconductor device substrate as claimed in claim 1, wherein the pyramidal shape of said mounting terminal is defined by crystal planes of said silicon substrate.

7. The semiconductor device substrate as claimed in claim 6, wherein said first and second surfaces of said silicon substrate are substantially parallel to the (001) plane of silicon crystal.

8. The semiconductor device substrate as claimed in claim 7, wherein said mounting terminal has a hollow pyramidal shape.

9. The semiconductor device substrate as claimed in claim 1, wherein a top end of said mounting terminal protrudes from said second surface of said silicon substrate.

10. A semiconductor package comprising:
a semiconductor device substrate; and
a semiconductor element having at least one metal bump formed on an electrode pad thereof,
wherein said semiconductor device substrate comprising:
   a silicon substrate having a first surface and a second surface opposite to the first surface;
   at least one mounting terminal having a pyramidal shape and extending between said first and second surfaces, an end of said mounting terminal protruding from one of said first and second surfaces; and
   a wiring layer formed on said first surface of said silicon substrate, the wiring layer including a conductive layer that is electrically connected to the mounting terminal, and
wherein an end of said mounting terminal of said semiconductor device substrate is connected to said metal bump in a state where the end of said mounting terminal protrudes into the metal bump.

11. A semiconductor package comprising:

a semiconductor device substrate; and a semiconductor element having at least one metal bump formed on an electrode pad thereof, wherein said semiconductor device substrate comprising:
   a silicon substrate having a first surface and a second surface opposite to the first surface;
   at least one mounting terminal having a pyramidal shape and extending between said first and second surfaces, an end of said mounting terminal protruding from one of said first and second surfaces; and
   a wiring layer formed on said first surface of said silicon substrate, the wiring layer including a conductive layer that is electrically connected to the mounting terminal, and wherein said semiconductor element is mounted on the wiring layer of said semiconductor device substrate, and said mounting terminal of a pyramidal shape is used as an external connection terminal.

12. A semiconductor package comprising:

a semiconductor element;

a semiconductor device substrate having a first surface and a second surface opposite to said first surface, the semiconductor element being mounted on the first surface; and a package substrate facing the second surface of said semiconductor device substrate and electrically connected to said semiconductor element via said semiconductor device substrate, wherein said semiconductor device substrate comprising:
   a silicon substrate having said first surface and said second surface opposite to the first surface;
   at least one mounting terminal having a pyramidal shape and extending between said first and second surfaces, an end of said mounting terminal protruding from one of said first and second surfaces; and
   a wiring layer formed on said first surface of said silicon substrate, the wiring layer including a conductive layer that is electrically connected to the mounting terminal.

* * * * *